United States Patent
Burns et al.

(10) Patent No.: US 7,066,741 B2
(45) Date of Patent: *Jun. 27, 2006

(54) FLEXIBLE CIRCUIT CONNECTOR FOR STACKED CHIP MODULE

(75) Inventors: Carmen D. Burns, Austin, TX (US); David Roper, Austin, TX (US); James W. Cady, Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/449,242

(22) Filed: May 30, 2003

(65) Prior Publication Data

US 2003/0203663 A1 Oct. 30, 2003

Related U.S. Application Data

(63) Continuation of application No. 10/101,039, filed on Mar. 19, 2002, now Pat. No. 6,572,387, which is a continuation of application No. 09/406,015, filed on Sep. 24, 1999, now abandoned.

(51) Int. Cl.
*H01R 9/09* (2006.01)
(52) U.S. Cl. .......................................... 439/69; 361/790
(58) Field of Classification Search .................. 439/69; 361/790, 735; 257/686, 777
See application file for complete search history.

(56) References Cited

U.S. PATENT DOCUMENTS

| | | | | |
|---|---|---|---|---|
| 3,246,386 A | 4/1966 | Ende | ........................ | 29/155.5 |
| 3,287,606 A | 11/1966 | Schwartz | ..................... | 317/101 |
| 3,290,559 A | 12/1966 | Kirby | ........................ | 317/101 |
| 3,313,986 A | 4/1967 | Kirby | ........................ | 317/101 |
| 3,377,516 A | 4/1968 | Ellett | ........................ | 317/101 |
| 3,403,300 A | 9/1968 | Horowitz et al. | ........... | 317/101 |
| 3,436,604 A | 4/1969 | Hyltin et al. | ................ | 317/101 |

(Continued)

FOREIGN PATENT DOCUMENTS

EP 122-687 A 10/1984

(Continued)

OTHER PUBLICATIONS

Dense-Pac Microsystems, Inc., Catalog describing two products: DPS512X16A3 Ceramic 512KX16 CMOS SRAM Module, pp. 865-870, no date.

(Continued)

*Primary Examiner*—Tulsidas C. Patel
*Assistant Examiner*—Thanh-Tam Le
(74) *Attorney, Agent, or Firm*—J. Scott Denko

(57) ABSTRACT

The present invention provides a flexible circuit connector for electrically coupling IC devices to one another in a stacked configuration. Each IC device includes: (1) a package having top, bottom, and peripheral sides; and (2) external leads that extend out from at least one of the peripheral sides. In one embodiment, the flexible circuit connector comprises a plurality of discrete conductors that are adapted to be mounted between the upper side of a first package and the lower side of a second package. The flexible circuit connector also includes distal ends that extend from the conductors. The distal ends are adapted to be electrically connected to external leads from the first and second packages to interconnect with one another predetermined, separate groups of the external leads. In this manner, individual devices within a stack module can be individually accessed from traces on a circuit card. This flexible capability is beneficial in modules such as memory modules with multiple, stacked memory devices.

6 Claims, 7 Drawing Sheets

U.S. PATENT DOCUMENTS

| | | | |
|---|---|---|---|
| 3,515,949 A | 6/1970 | Michaels | 317/101 |
| 3,535,595 A | 10/1970 | Moore | 317/101 |
| 3,614,541 A | 10/1971 | Farrand | 317/101 |
| 3,614,546 A | 10/1971 | Avins | 174/234 |
| 3,671,812 A | 6/1972 | Peluso et al. | 317/118 |
| 3,713,893 A | 1/1973 | Shirland | 136/89 |
| 3,727,064 A | 4/1973 | Bottini | 250/217 |
| 3,739,462 A | 6/1973 | Hasty | 29/577 |
| 3,746,934 A | 7/1973 | Stein | 317/101 |
| 3,772,776 A | 11/1973 | Weisenburger | 29/628 |
| 3,925,801 A | 12/1975 | Haitz et al. | 357/19 |
| 3,949,274 A | 4/1976 | Anacker | 317/101 |
| 3,959,579 A | 5/1976 | Johnson | 174/68.5 |
| 4,017,963 A | 4/1977 | Beyerlein | 29/577 |
| 4,103,318 A | 7/1978 | Schwede | 361/388 |
| 4,116,518 A | 9/1978 | Pleskac | 339/17 |
| 4,116,519 A | 9/1978 | Grabbe et al. | 339/17 |
| 4,139,726 A | 2/1979 | Penrod et al. | 174/52 |
| 4,158,745 A | 6/1979 | Keller | 174/52 |
| 4,241,493 A | 12/1980 | Andrulitis et al. | 29/572 |
| 4,288,808 A | 9/1981 | Hantusch | 357/68 |
| 4,288,841 A | 9/1981 | Gogal | 361/414 |
| 4,321,418 A | 3/1982 | Dran et al. | 136/251 |
| 4,331,258 A | 5/1982 | Geschwind | 220/359 |
| 4,364,620 A | 12/1982 | Mulholland et al. | 339/17 |
| 4,371,912 A | 2/1983 | Guzik | 361/417 |
| 4,379,259 A | 4/1983 | Varadi et al. | 324/73 |
| 4,394,712 A | 7/1983 | Anthony | 361/411 |
| 4,398,235 A | 8/1983 | Lutz et al. | 361/393 |
| 4,406,508 A | 9/1983 | Sadigh-Behzadi | 339/75 |
| 4,437,235 A | 3/1984 | McIver | 29/840 |
| 4,451,973 A | 6/1984 | Tateno et al. | 29/588 |
| 4,521,828 A | 6/1985 | Fanning | 361/386 |
| 4,525,921 A | 7/1985 | Carson et al. | 29/577 |
| 4,571,663 A | 2/1986 | McPherson | 361/393 |
| 4,574,331 A | 3/1986 | Smolley | 361/393 |
| 4,587,596 A | 5/1986 | Bunnell | 361/398 |
| 4,630,172 A | 12/1986 | Stenerson et al. | 361/386 |
| 4,631,573 A | 12/1986 | Sutrina | 357/82 |
| 4,633,573 A | 1/1987 | Scherer | 29/589 |
| 4,638,348 A | 1/1987 | Brown et al. | 357/74 |
| 4,638,406 A | 1/1987 | Samson | 361/403 |
| 4,642,735 A | 2/1987 | Hodsdon et al. | 361/424 |
| 4,680,617 A | 7/1987 | Ross | 357/72 |
| 4,684,975 A | 8/1987 | Takiar et al. | 357/70 |
| 4,688,864 A | 8/1987 | Sorel | 439/74 |
| 4,696,525 A * | 9/1987 | Coller et al. | 439/69 |
| 4,698,663 A | 10/1987 | Sugimoto et al. | 357/81 |
| 4,706,166 A | 11/1987 | Go | 361/403 |
| 4,712,129 A | 12/1987 | Orcutt | 357/84 |
| 4,722,060 A | 1/1988 | Quinn et al. | 364/490 |
| 4,722,691 A | 2/1988 | Gladd et al. | 439/79 |
| 4,733,461 A | 3/1988 | Nakano | 29/830 |
| 4,761,681 A | 8/1988 | Reid | 357/68 |
| 4,763,188 A | 8/1988 | Johnson | 357/74 |
| 4,764,846 A | 8/1988 | Go | 361/403 |
| 4,770,640 A | 9/1988 | Walter | 439/69 |
| 4,796,078 A | 1/1989 | Phelps, Jr. et al. | 357/68 |
| 4,821,007 A | 4/1989 | Fields et al. | 333/238 |
| 4,821,148 A | 4/1989 | Kobayashi et al. | 361/392 |
| 4,823,234 A | 4/1989 | Konishi et al. | 361/386 |
| 4,829,403 A | 5/1989 | Harding | 361/386 |
| 4,833,568 A | 5/1989 | Berhold | 361/383 |
| 4,839,717 A | 6/1989 | Phy et al. | 357/74 |
| 4,841,355 A | 6/1989 | Parks | 357/82 |
| 4,855,868 A | 8/1989 | Harding | 361/386 |
| 4,862,245 A | 8/1989 | Pashby et al. | 357/70 |
| 4,862,249 A | 8/1989 | Carlson | 357/80 |
| 4,868,712 A | 9/1989 | Woodman | 361/388 |
| 4,878,106 A | 10/1989 | Sachs | 357/72 |
| 4,884,237 A | 11/1989 | Mueller et al. | 365/63 |
| 4,891,789 A | 1/1990 | Quattrini et al. | 365/63 |
| 4,911,643 A | 3/1990 | Perry et al. | 439/67 |
| 4,924,352 A | 5/1990 | Septfons | 361/388 |
| 4,948,645 A | 8/1990 | Holzinger et al. | 428/40 |
| 4,953,005 A | 8/1990 | Carllson et al. | 357/80 |
| 4,953,060 A | 8/1990 | Lauffer et al. | 361/388 |
| 4,956,694 A | 9/1990 | Eide | 357/74 |
| 4,983,533 A | 1/1991 | Go | 437/7 |
| 4,994,411 A | 2/1991 | Naito et al. | 437/209 |
| 4,996,583 A | 2/1991 | Hatada | 357/70 |
| 4,996,587 A | 2/1991 | Hinrichsmeyer et al. | 357/74 |
| 4,997,517 A | 3/1991 | Parthasarathi | 156/630 |
| 5,001,545 A | 3/1991 | Kalfus et al. | 357/70 |
| 5,012,323 A | 4/1991 | Farnworth | 357/75 |
| 5,014,113 A | 5/1991 | Casto | 357/70 |
| 5,016,138 A | 5/1991 | Woodman | 361/381 |
| 5,025,307 A | 6/1991 | Ueda et al. | 357/80 |
| 5,031,072 A | 7/1991 | Malhi et al. | 361/387 |
| 5,034,350 A | 7/1991 | Marchisi | 437/207 |
| 5,041,015 A | 8/1991 | Travis | 439/492 |
| 5,041,395 A | 8/1991 | Steffen | 437/206 |
| 5,043,794 A | 8/1991 | Tai et al. | 357/74 |
| 5,049,527 A | 9/1991 | Merrick et al. | 437/220 |
| 5,057,903 A | 10/1991 | Olla | 357/72 |
| 5,057,906 A | 10/1991 | Ishigami | 357/80 |
| 5,058,265 A | 10/1991 | Goldfarb | 29/852 |
| 5,065,277 A | 11/1991 | Davidson | 361/383 |
| 5,068,708 A | 11/1991 | Newman | 357/68 |
| 5,086,018 A | 2/1992 | Conru et al. | 437/207 |
| 5,099,393 A | 3/1992 | Bentlage et al. | 361/413 |
| 5,101,324 A | 3/1992 | Sato | 361/400 |
| 5,104,820 A | 4/1992 | Go, deceased et al. | 437/51 |
| 5,107,328 A | 4/1992 | Kinsman | 357/74 |
| 5,108,553 A | 4/1992 | Foster et al. | 205/125 |
| 5,128,831 A | 7/1992 | Fox, III et al. | 361/396 |
| 5,138,430 A | 8/1992 | Gow, 3rd et al. | 357/70 |
| 5,138,434 A | 8/1992 | Wood et al. | 357/74 |
| 5,140,745 A | 8/1992 | McKenzie, Jr. | 29/852 |
| 5,151,559 A | 9/1992 | Conru et al. | 174/52.4 |
| 5,155,068 A | 10/1992 | Tada | 438/125 |
| 5,159,434 A | 10/1992 | Kohno et al. | 358/80 |
| 5,168,926 A | 12/1992 | Watson et al. | 165/185 |
| 5,198,888 A | 3/1993 | Sugano et al. | 257/686 |
| 5,200,362 A | 4/1993 | Lin et al. | 437/207 |
| 5,214,307 A | 5/1993 | Davis | 257/676 |
| 5,214,845 A | 6/1993 | King et al. | 29/841 |
| 5,221,642 A | 6/1993 | Burns | 437/207 |
| 5,222,014 A | 6/1993 | Lin | 361/414 |
| 5,223,739 A | 6/1993 | Katsumata et al. | 257/676 |
| 5,231,304 A | 7/1993 | Solomon | 257/684 |
| 5,236,117 A | 8/1993 | Roane et al. | 228/180.21 |
| 5,239,447 A | 8/1993 | Cotues et al. | 361/744 |
| 5,241,454 A | 8/1993 | Ameen et al. | 361/744 |
| 5,243,133 A | 9/1993 | Engle et al. | 174/52.4 |
| 5,247,423 A | 9/1993 | Lin et al. | 361/719 |
| 5,252,857 A | 10/1993 | Kane et al. | 257/686 |
| 5,259,770 A | 11/1993 | Bates et al. | 439/66 |
| 5,262,927 A | 11/1993 | Chia et al. | 361/784 |
| 5,266,834 A | 11/1993 | Nishi et al. | 257/706 |
| 5,273,940 A | 12/1993 | Sanders | 437/209 |
| 5,279,029 A | 1/1994 | Burns | 29/856 |
| 5,279,991 A | 1/1994 | Minahan et al. | 437/208 |
| 5,281,852 A | 1/1994 | Normington | 257/685 |
| 5,307,929 A | 5/1994 | Seidler | 206/331 |
| 5,311,060 A | 5/1994 | Rostoker et al. | 257/796 |
| 5,311,401 A | 5/1994 | Gates, Jr. et al. | 361/760 |
| 5,313,096 A | 5/1994 | Eide | 257/686 |
| 5,313,097 A | 5/1994 | Haj-Ali-Ahmadi et al. | 257/706 |
| 5,343,075 A | 8/1994 | Nishino | 257/686 |
| 5,343,366 A | 8/1994 | Cipolla et al. | 361/785 |
| 5,347,428 A | 9/1994 | Carson et al. | 361/760 |
| 5,347,429 A | 9/1994 | Kohno et al. | 361/813 |
| 5,367,766 A | 11/1994 | Burns et al. | 29/848 |

| | | | | |
|---|---|---|---|---|
| 5,369,056 A | 11/1994 | Burns et al. | ............... | 437/209 |
| 5,369,058 A | 11/1994 | Burns et al. | ............... | 437/209 |
| 5,371,866 A | 12/1994 | Cady | ....................... | 395/400 |
| 5,373,189 A | 12/1994 | Massit et al. | .............. | 257/686 |
| 5,377,077 A | 12/1994 | Burns | ....................... | 361/704 |
| 5,384,689 A | 1/1995 | Shen | ......................... | 361/761 |
| 5,394,010 A | 2/1995 | Tazawa et al. | ............. | 257/686 |
| 5,397,916 A | 3/1995 | Normington | ............... | 257/686 |
| 5,420,751 A | 5/1995 | Burns | ....................... | 361/707 |
| 5,426,566 A | 6/1995 | Beilstein, Jr. et al. | ...... | 361/735 |
| 5,438,224 A | 8/1995 | Papageorge et al. | ........ | 257/777 |
| 5,446,313 A | 8/1995 | Masuda et al. | ............ | 257/666 |
| 5,446,620 A | 8/1995 | Burns | ....................... | 361/704 |
| 5,475,920 A | 12/1995 | Burns et al. | ................. | 29/856 |
| 5,477,082 A | 12/1995 | Buckley, III et al. | ....... | 257/679 |
| 5,479,318 A | 12/1995 | Burns | ....................... | 361/735 |
| 5,481,133 A | 1/1996 | Hsu | ......................... | 257/621 |
| 5,484,959 A | 1/1996 | Burns | ....................... | 174/524 |
| 5,493,476 A | 2/1996 | Burns | ....................... | 361/735 |
| 5,499,160 A | 3/1996 | Burns | ....................... | 361/704 |
| 5,514,907 A | 5/1996 | Moshayedi | ................ | 257/686 |
| 5,523,619 A | 6/1996 | McAllister et al. | ........ | 257/686 |
| 5,543,664 A | 8/1996 | Burns | ....................... | 257/787 |
| 5,550,711 A | 8/1996 | Burns et al. | ................ | 361/728 |
| 5,552,963 A | 9/1996 | Burns | ....................... | 361/735 |
| 5,561,591 A | 10/1996 | Burns | ....................... | 361/704 |
| 5,566,051 A | 10/1996 | Burns | ....................... | 361/704 |
| 5,586,009 A | 12/1996 | Burns | ....................... | 361/735 |
| 5,588,205 A | 12/1996 | Roane | ....................... | 29/830 |
| 5,592,364 A | 1/1997 | Roane | ....................... | 361/735 |
| 5,605,592 A | 2/1997 | Burns | ....................... | 156/182 |
| 5,612,570 A | 3/1997 | Eide et al. | ................. | 257/686 |
| 5,615,475 A | 4/1997 | Burns | ....................... | 29/827 |
| 5,631,193 A * | 5/1997 | Burns | ....................... | 29/827 |
| 5,644,161 A | 7/1997 | Burns | ....................... | 257/668 |
| 5,654,877 A | 8/1997 | Burns | ....................... | 361/713 |
| 5,657,537 A | 8/1997 | Saia et al. | ................... | 29/830 |
| 5,723,903 A | 3/1998 | Masuda et al. | ............ | 257/696 |
| 5,778,522 A | 7/1998 | Burns | ....................... | 29/830 |
| 5,783,464 A | 7/1998 | Burns | ....................... | 438/112 |
| 5,789,815 A | 8/1998 | Tessier et al. | ............. | 257/723 |
| 5,801,437 A | 9/1998 | Burns | ....................... | 257/685 |
| 5,804,870 A | 9/1998 | Burns | ....................... | 257/666 |
| 5,828,125 A | 10/1998 | Burns | ....................... | 257/668 |
| 5,835,988 A | 11/1998 | Ishii | ......................... | 257/684 |
| 5,843,807 A | 12/1998 | Burns | ....................... | 438/109 |
| 5,864,175 A | 1/1999 | Burns | ....................... | 257/684 |
| 5,894,984 A | 4/1999 | Sakai et al. | ............ | 228/180.22 |
| 5,895,232 A | 4/1999 | Burns | ....................... | 438/107 |
| 5,917,709 A | 6/1999 | Johnson et al. | ............ | 361/803 |
| 5,960,539 A | 10/1999 | Burns | ....................... | 29/854 |
| 5,978,227 A | 11/1999 | Burns | ....................... | 361/735 |
| 6,014,316 A | 1/2000 | Eide | ......................... | 361/735 |
| 6,025,642 A | 2/2000 | Burns | ....................... | 257/686 |
| 6,028,352 A * | 2/2000 | Eide | ......................... | 257/686 |
| 6,028,365 A | 2/2000 | Akram et al. | ............... | 257/778 |
| 6,049,123 A | 4/2000 | Burns | ....................... | 257/686 |
| RE36,916 E | 10/2000 | Moshayedi | ................ | 257/723 |
| 6,133,637 A | 10/2000 | Hikita et al. | .............. | 257/777 |
| 6,153,929 A | 11/2000 | Moden et al. | .............. | 257/686 |
| 6,157,541 A | 12/2000 | Hacke | ....................... | 361/749 |
| 6,168,970 B1 | 1/2001 | Burns | ....................... | 438/106 |
| 6,172,874 B1 | 1/2001 | Bartilson | .................... | 361/719 |
| 6,178,093 B1 | 1/2001 | Bhatt et al. | ................ | 361/795 |
| 6,187,652 B1 | 2/2001 | Chou et al. | ................ | 438/455 |
| 6,194,247 B1 | 2/2001 | Burns | ....................... | 438/107 |
| 6,205,654 B1 | 3/2001 | Burns | ....................... | 29/830 |
| 6,262,476 B1 | 7/2001 | Vidal | ....................... | 257/686 |
| 6,300,679 B1 | 10/2001 | Mukerji et al. | ............ | 257/738 |
| 6,303,981 B1 | 10/2001 | Moden | ...................... | 257/666 |
| 6,313,998 B1 | 11/2001 | Kledzik et al. | ............. | 361/767 |
| 6,316,825 B1 * | 11/2001 | Park et al. | .................. | 257/686 |
| 6,323,060 B1 | 11/2001 | Isaak | ....................... | 438/109 |
| 6,335,565 B1 | 1/2002 | Miyamoto et al. | ......... | 257/686 |
| 6,376,769 B1 | 4/2002 | Chung | ....................... | 174/52.2 |
| 6,426,240 B1 | 7/2002 | Isaak | ......................... | 438/106 |
| 6,426,560 B1 | 7/2002 | Kawamura et al. | ......... | 257/777 |
| 6,462,408 B1 | 10/2002 | Wehrly, Jr. | ................. | 257/686 |
| 6,489,687 B1 | 12/2002 | Hashimoto | .................. | 257/777 |

FOREIGN PATENT DOCUMENTS

| | | |
|---|---|---|
| EP | 0 298 211 A3 | 1/1989 |
| JP | 57-31166 A | 2/1982 |
| JP | 58-112348 A | 4/1983 |
| JP | 58-96756 A | 8/1983 |
| JP | 58-219757 A | 12/1983 |
| JP | 60-160641 | 8/1985 |
| JP | 60-254762 A | 12/1985 |
| JP | 61-63048 | 4/1986 |
| JP | 61-75558 A | 4/1986 |
| JP | 61-163652 A | 7/1986 |
| JP | 61-219143 A | 9/1986 |
| JP | 62-230027 A | 8/1987 |
| JP | 63-117451 A | 5/1988 |
| JP | 63-153849 A | 6/1988 |
| JP | 2-260448 | 10/1990 |
| JP | 3-96266 | 4/1991 |
| JP | 3-167868 A | 7/1991 |
| JP | 4-209562 | 7/1992 |
| JP | 6-77644 | 8/1992 |
| SU | 834-957 | 5/1981 |

OTHER PUBLICATIONS

Dense-Pac Microsystems, Inc., "Memory Products-ShortForm-Q4," 1994, 5 pages, no date.
Dense-Pac Microsystems, Inc., "Short Order Catalog," 1990, 12 pages, no date.
Dense-Pac Microsystems, Inc., "Short Form Catalog," 1991, 20 pages, no date.
Dense-Pac Microsystems, Inc., "3-D Technology," 1993, 15 pages, no date.
Dense-Pac Microsystems, Inc., 16-Megabit High Speed CMOS SRAM, no date.
Dense-Pac Microsystems, Inc., 128-Megabyte SDRAM Sodimm, no date.
Dense-Pac Microsystems, Inc., 256-Megabyte CMOS DRAM, no date.
Dense-Pac Microsystems, Inc., flyer/"While others are still defining it . . . Our customers are cashing in!", no date.
Tuckerman, D.B. et al., "Laminated Memory: A New 3-Dimensional Packaging Technology for MCMs" article, nCHIP, Inc., IEEE, 1994, no date.
1992 Proceedings, 42$^{nd}$ Electronic Components & Technology Conference, May 18-20, 1992.
Research Disclosure, Organic Card Device Carrier, 31318. May 1990, No. 313.
"Introducing a Revolutionary 3 Dimensional Package Type—The SLCC," John Forthun, Advancement in Technology, Feb. 26, 1992, 12 pages.
"New levels of hybrid IC density are provided by Three-Dimensional Packaging" article, 2 pages, no date.
3-D Integrated Packaging and Interconnect Technology; Wescon/90 Conference Record, held Nov. 13-15, 1990, Anahein, CA.
Christian VAL and Thierry Lenoin, 3d Interconnection for Ultra-Dense Multichip Modules, IEEE, pp. 540-547, no date.
"Alternative assembly for Memory Ics"XP-002093051, Electronic Engineering, Jan. 1987. p. 22, no day.
Dean Frew, "High Density Memory Packaging Technology High Speed Imaging Applications, "SPIE, vol. 1346*Ultra-*

*high-and High-Speed Photography, Videography, Photonics, and Velocimetry* '90, pp. 200-209, no date.

International Electronic Device Meeting, IEDM Technical Digest, Washington, D.C., Dec. 6-9, 1987.

Patent Abstract of Japan, Publication No. 05029534, Published May 2, 1993, Inventor: Nakamura Shigemi, entitled "Memory Module", European Patent Office.

Alvin Weinburg and W. Kinzy Jones, "Vertically-Integrated Package," IEEE, pp. 436-443, no date.

IBM Technical Disclosure Bulletin, vol. 32 No. 3B Aug. 1989, no day.

IBM Technical Disclosure Bulletin, vol. 20 No. 11A Apr. 1978, no day.

IBM Technical Disclosure Bulletin, vol. 23 No. 12 May 1981, no day.

IBM Technical Disclosure Bulletin, vol. 30, No. 8, Jan. 8, 1988, pp. 373-374.

"Declaration of Mark Moshayedi in Support of Plaintiff/CounterDefendant's Motion for Summary Judgment of Non-Infringement of U.S. Patent No. 4,956,694," Civil Action No. SACV-98-822, *Simple Technology, Inc. v. Dense-Pac Microsystems, Inc.*, 20 total pages (9 pages of the Declaration and 11 pages of attachments to Declaration), no date.

\* cited by examiner

FIG. 2C
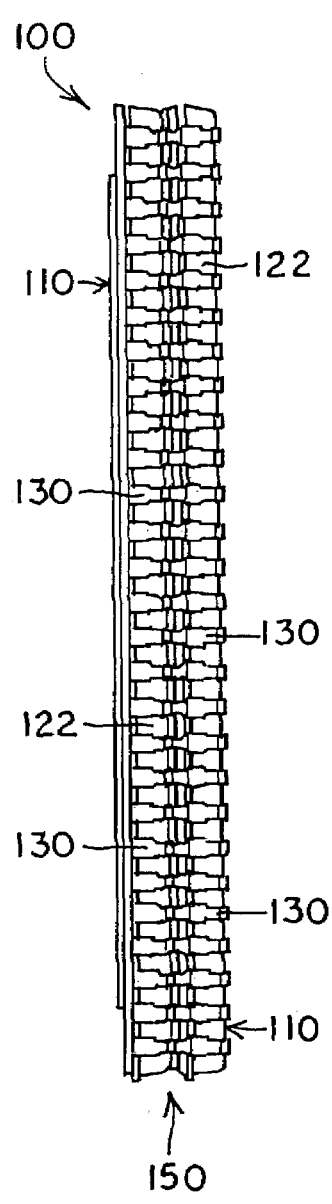
FIG. 2A
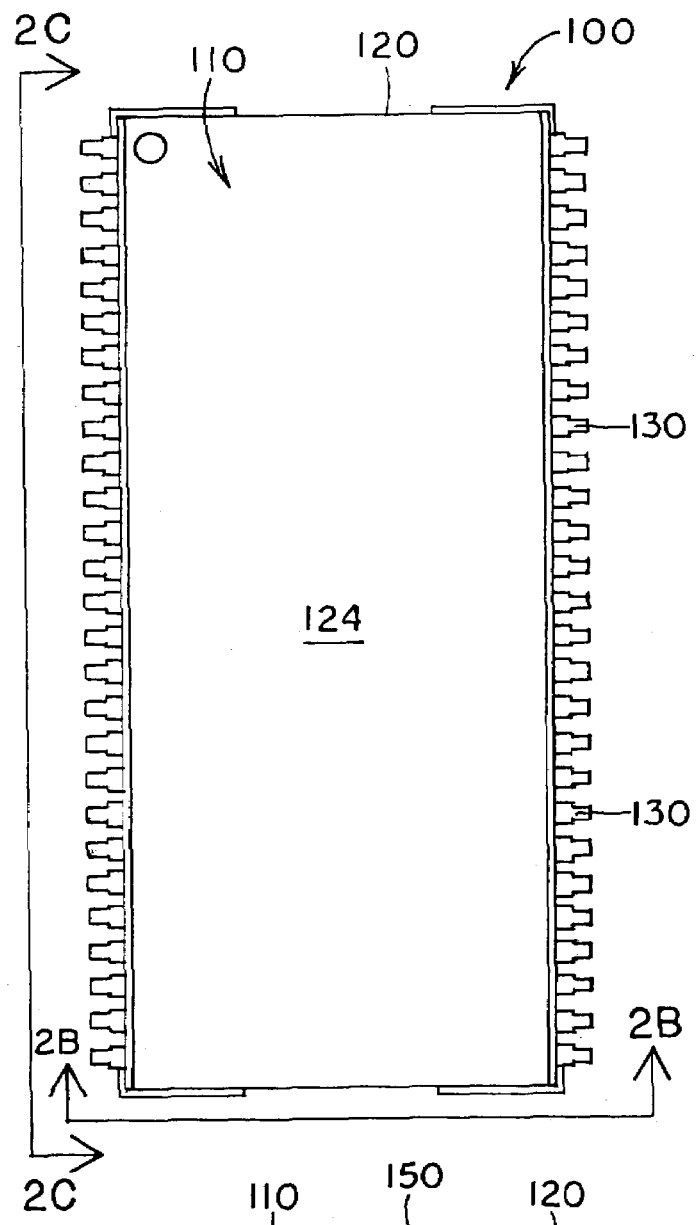
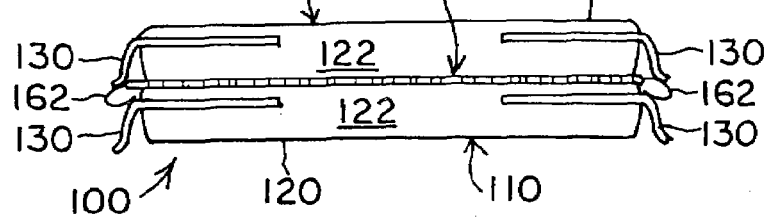
FIG. 2B

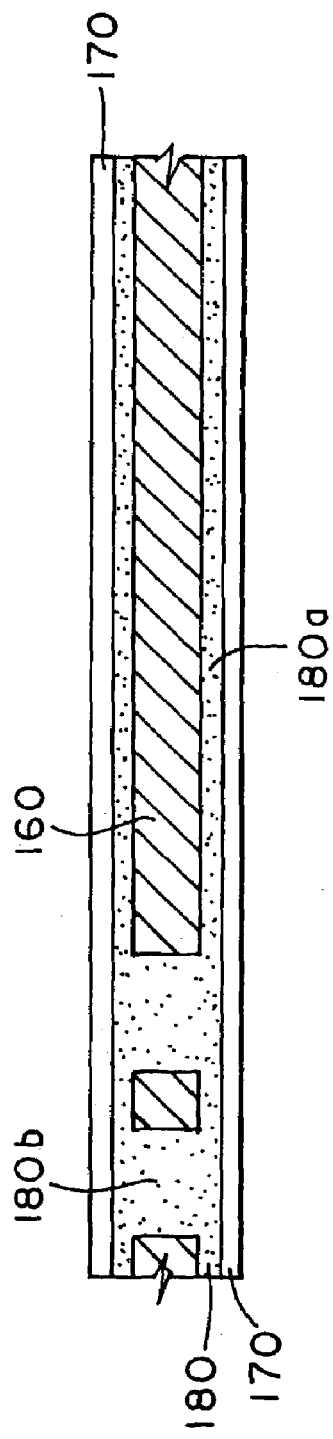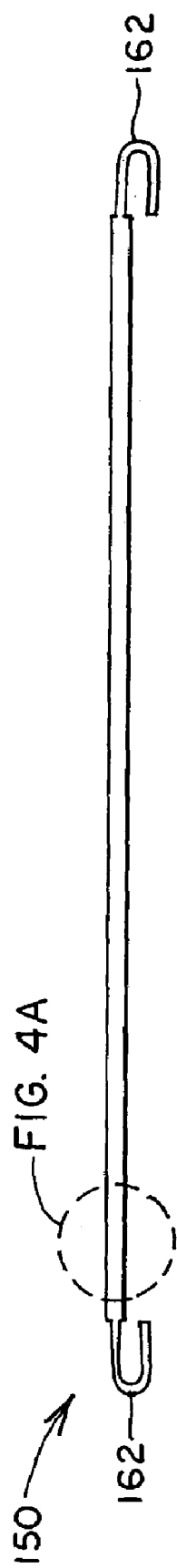

SECTION D-D

FLEXIBLE CIRCUIT CONNECTOR FOR STACKED CHIP MODULE

This application is a continuation of U.S. patent application Ser. No. 10/101,039, now U.S. Pat. No. 6,572,387, filed Mar. 19, 2002, which is a continuing prosecution application of U.S. patent application Ser. No. 09/406,015, filed Sep. 24, 1999, which is now abandoned. Both U.S. Pat. No. 6,572,387 and U.S. patent application Ser. No. 09/406,015 are incorporated herein by reference.

TECHNICAL FIELD

This invention relates to integrated to circuit devices. More particulary, this invention relates to a flexible circuit connector for a stacked integrated circuit module.

BACKGROUND

Designers of computers and other electronic systems constantly strive to miniaturize integrated circuit ("IC") devices and modules to place more circuits in smaller spaces while operating at higher speeds. Because of this demand, there is a need to develop smaller, yet denser, memory packages, or modules, and other small, yet dense, modules containing integrated circuit devices, such as microprocessors, memory devices, DMA devices, etc. Typically, these modules not only require external electrical connections to other modules or external electronic circuits, but also, they require internal communication paths, or buses, for data communication between the discrete semiconductor devices within the module itself. The problem then has arisen with regard to how to create electronic pathways, or buses, for stacked packaged integrated circuits that are physically external to-the integrated circuit package and provide an external communication path from the circuit board to each of the individual integrated circuit devices within the stacked module.

Various schemes have been developed to provide these interconnections. Rail bus systems, for example, are described in U.S. Pat. Nos. 5,279,029 and 5,484,959, both of which are commonly owned by the assignee of the present invention. These systems use external bus rails to interconnect the external leads of the stacked IC devices. Unfortunately, rail systems can be costly. Rail-less schemes have been developed that use various means for interconnecting the external leads from the stacked devices. For example, U.S. Pat. No. 4,696,525 to Coller et al. teaches a socket connector for coupling adjacent devices in a stacked configuration to one another. The socket has external conductors that interconnect leads from like, adjacent devices to one another. Sockets, however, are limited in several respects. They are not versatile in their ability to implement complex interconnections. In addition, such sockets, which have relatively thick, plastic bodies, act as heat insulators between adjoining upper and lower (major) package surfaces, which can inhibit the module's overall ability to dissipate heat. Co-pending application Ser. No. 08/645,319 to Burns, which is also commonly owned by the assignee of this invention, discloses an external intermediate lead frame for interconnecting adjacent packages. This lead frame solution has improved interconnection and heat transfer capability. However, an even better, more inter-connectively versatile and thermally conductive solution is desired.

Accordingly, what is needed is an improved apparatus for electrically and thermally coupling adjacent integrated circuit devices in a stacked module.

SUMMARY OF THE INVENTION

The present invention provides a flexible circuit connector for electrically and thermally coupling adjacent IC packages to one another in a stacked configuration. Each IC package includes: (1) a package having top, bottom, and peripheral sides; (2) external leads that extend out from at least one of the peripheral sides of the package; and (3) an IC inside the package connected to the external leads. In one embodiment, the flexible circuit connector comprises a plurality of discrete conductors that are adapted to be mounted between the upper side of a first package and the lower side of a second package. The flexible circuit connector also includes distal ends that extend from the conductors. The distal ends are adapted to be electrically connected to external leads from the first and second packages to interconnect with one another selected, separate groups of the external leads. In this manner, individual devices within a stack module can be accessed by a circuit card or printed circuit board. This versatility is beneficial in modules such as memory modules, which can have multiple, stacked memory devices.

BRIEF DESCRIPTION OF THE DRAWINGS

FIG. 2A shows a top view of a stacked chip module of the present invention.

FIG. 2B shows an end view of the module of FIG. 2A taken along line 2B—2B.

FIG. 2C shows a side view of the module of FIG. 2A taken along line 2C—2C.

FIG. 4 shows a side view of the stacked chip flexible circuit connector of FIG. 1 with a magnified view of its layered structure.

DETAILED DESCRIPTION

Figure 1:
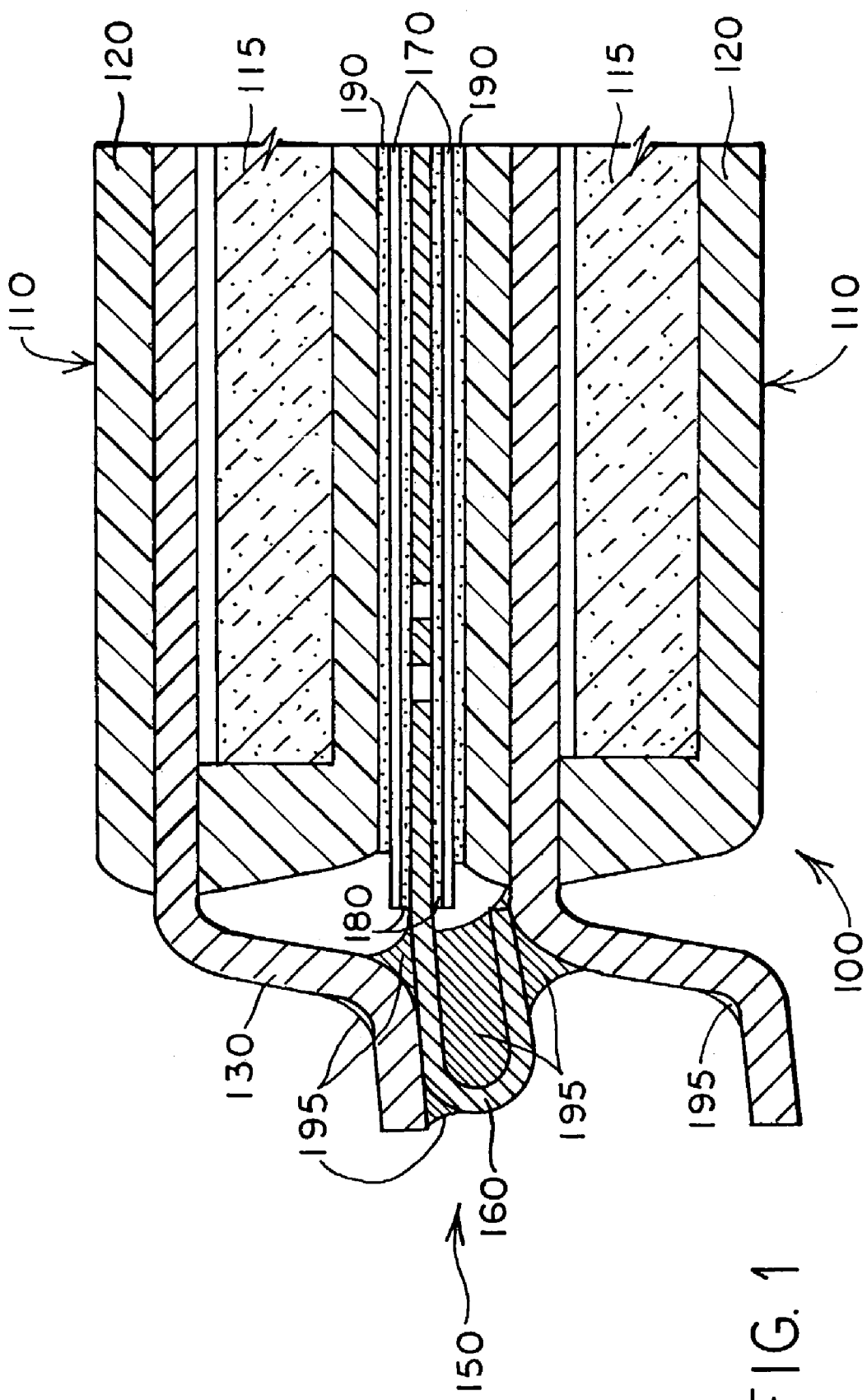
FIG. 1 depicts one embodiment of a stacked chip module of the present invention.

FIGS. 1 and 2A through 2C show one embodiment of a stacked chip module 100 of the present invention. Module 100 includes first and second IC devices 110 stacked atop and electrically connected to one another through flexible circuit connector 150. Each IC device 110 includes (1) a package 120, (e.g., a plastic package) that protectively encapsulates an internal semiconductor die 115, and (2) external leads 130 extending out from the package 120. Package 120 includes peripheral sides 122 and upper and lower sides 124.

The depicted flexible circuit connector 150 comprises conductor assembly 160 sandwiched between first and second insulator (electrical) layers 170. In the depicted embodiment, flexible circuit connector 150 also includes adhesive element 180 between insulator layers 170 for adherence to conductor assembly 160. Upper and lower packages 120 are mounted against the first (upper) and second (lower) insulator layers 170 of flexible circuit connector 150 through a thermally-conductive (e.g., thin film) adhesive 190 in order to thermally connect and structurally secure flexible connector 150 and IC devices 110 in a stack configuration. Finally, bonding material (e.g., solder) electrically and structurally connects adjacent external leads 130 to one another through conductor assembly 160. It should be recognized that the phrase "mounted against" does not mean that the insulator layers 170 are necessarily in direct physical contact with the IC packages 120. As in the depicted embodiment, they may be separated by adhesive 190 or other suitable material. It simply means that the flexible circuit connector 150 is mounted—either directly or indirectly—between adjacent packages 120. This concept of "mounted against" also applies with respect to the insulator layers 170 being mounted against the conductor assembly 160.

Figure 3:
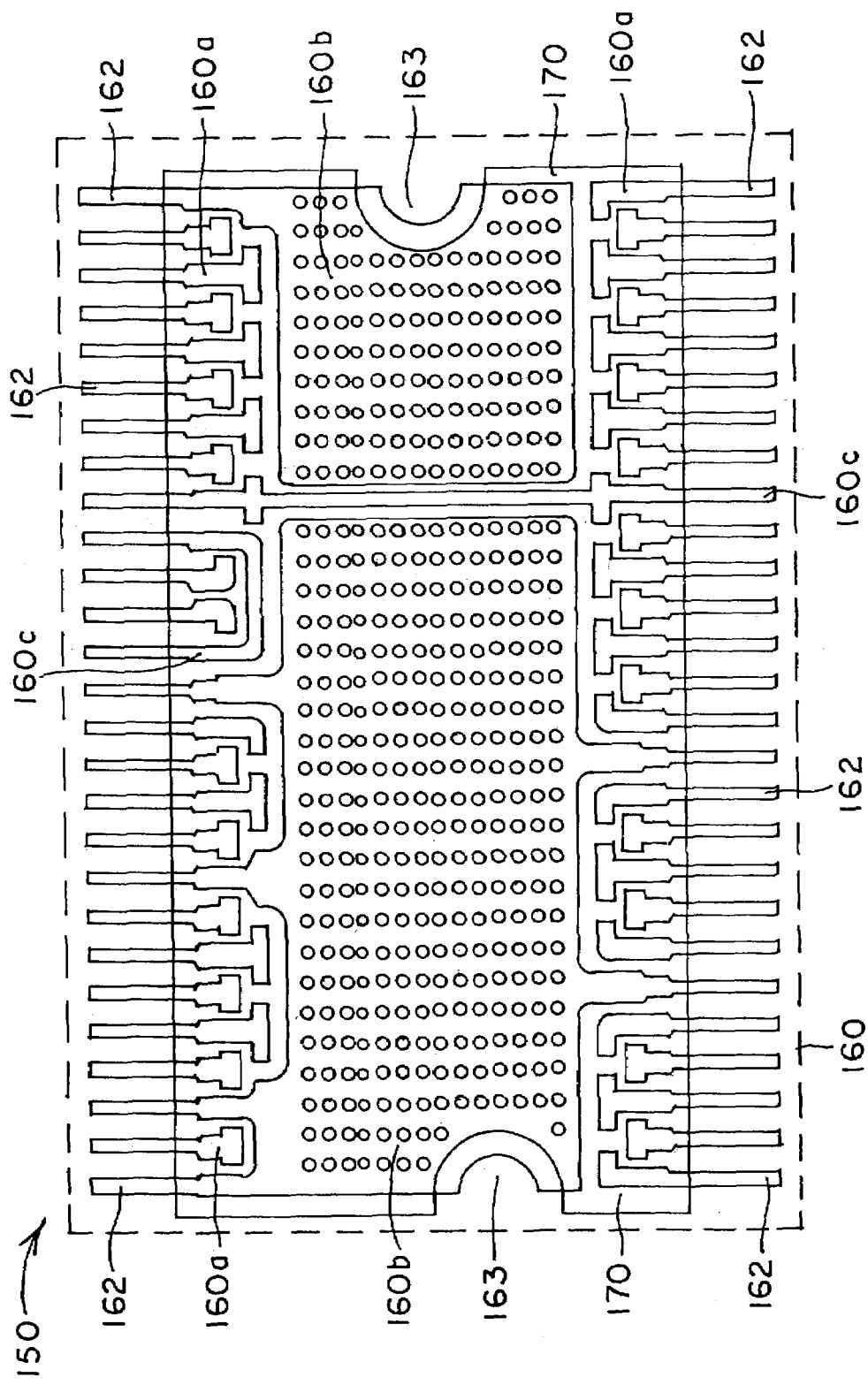
FIG. 3 shows a top view of a flexible circuit connector for a stacked chip module of the present invention.

With reference to FIGS. 3 and 4, conductor assembly 160 of flexible circuit connector 150 comprises a plurality of discrete conductors including singular conductors 160a, ground plane and thermal element conductors 160b, and jumper conductors 160c. Each discrete conductor includes at least one distal end 162 for electrically connecting to one another aligned external leads 130 from first and second devices 110. Aligned external leads in general are vertically aligned leads from adjacent IC devices that are in a stacked configuration. Aligned leads normally (but not always) correspond to like, adjacent leads (or pins) from like, adjacently stacked devices. In the depicted embodiments, the overall group of discrete conductors 160a, 160b, 160c define a generally planar conductor assembly 160. Flexible circuit connector 150 may also include offset notches 163 (which in the depicted embodiment are part of the ground conductor portions) for cooperating with automated manufacturing equipment (not shown) to ensure that the flexible circuit connector 150 is properly oriented during manufacturing.

Discrete conductors 160a, 160b, 160c are generally thin, trace-like members that are electrically and thermally conductive. They in connection with insulator layers 170 may be formed using conventional flex circuit methods. Accordingly, flexible circuit connectors 150 of the present invention may be derived from commercially available flexible circuit sources. In addition, the flexible circuit may either be single-sided (single insulative layer 170) or double-sided (first and second insulative layers 170).

A singular conductor 160a is a discrete conductor with one distal end for simply connecting a pair of aligned external leads 130. A ground plane conductor 160b is a discrete conductor that (either alone or in connection with other ground plane conductors) has a relatively large surface area, as compared to other individual discrete conductors, for functioning (e.g., signal return path) as a ground plane. In addition, a ground plane conductor has one or more distal ends 162 for electrical and thermal connection to external leads 130 that are to be grounded. A jumper conductor 160c is a discrete conductor with two or more distal ends for connecting two or more external leads of package 120 to one another and with their corresponding aligned leads from an adjacent package. As shown in FIG. 3, a ground plane and thermal element 160b may be segmented in order for a jumper conductor 160c to connect external leads 130 that extend from different peripheral sides 122. Alternatively, such a "jumped" connection could be made by using a multi-layered flexible circuit with overlapping and/or crossing (but not contacting) conductors.

A discrete conductor may be formed from any suitable material such as ½ hard copper 110 alloy. In the depicted embodiment, discrete conductors are approximately 0.003 inches thick. Electrical insulator layer(s) 170 may also be formed from any suitable flex circuit material, which when in contact with conductors sufficiently electrically isolates the discrete conductors from one another. In addition, electrical insulator layers 170 preferably have favorable heat transfer properties. Such a material would include but is not limited to a thin or a thermally conductive polymide. In the depicted embodiment, insulator layers 170 are approximately 0.001 inches thick.

Ground plane and thermal element 160b, apart from the other discrete conductors, generally reside in the center portion of the flexible circuit connector 150 approximately corresponding in size to the actual size of the integrated circuit devices 110. This ground plane and thermal element 160b improves the heat transfer capability of flex circuit connector 150. This enables the flex circuit connector 150 to more effectively conduct thermal energy between the multiple stacked integrated circuit devices 110 so that each device 110 in the module 100 benefits from the heat dissipation capacity of the whole module 100.

As shown in FIG. 4, adhesive element (at 180A) is not only used to adhere insulator layers 170 to the conductor assembly 160, but also, adhesive (at 180B) is used to fill between and adhere to one another insulator layers 170 where conductor assembly 160 is not present. In this depicted embodiment, the total thickness of flexible circuit connector 150 is approximately 0.008 inches.

Adhesive 190 improves the overall thermal conductivity of module 100 by tightly coupling the flexible circuit connector 150 between its adjacent IC package upper and lower sides 124. A suitable material for adhesive 190 could include, but is not limited to, a liquid adhesive such as Loctite or a dry-film adhesive, which is available from Rogers Corporation. In practical applications, flex connector 150 will generally have a non-homogeneous surface texture attributable to variances in the discrete conductor thicknesses within the conductor assembly 160. It has been discovered that when the range of these surface variances is less than 0.0005 inches, there are no significant differences between the use of the dry-film Rogers adhesive and the liquid Loctite adhesive. A tradeoff occurs between a thinner glueline and valley penetration capability with the liquid Loctite adhesive on the one hand and higher surface area contact with the Rogers adhesive on the other hand. However, when these texture variances are between 0.0005 and 0.002 inches, the Rogers adhesive (e.g., 1 mil. thick) is preferred. In general, the Rogers adhesive is more resilient and easier to implement since less surface preparation is required. When the surface variances exceed 0.002 inches, a pre-form adhesive material may be utilized.

With improved thermal conductivity resulting from implementation of a thin adhesive 190, the flexible circuit connector 150 is better able to transfer heat from the package's upper and lower sides 124 to the external leads 130, which act as fins dissipating heat away from the module 100. In a preferred embodiment, the ground plane and thermal element 160b for each flexible circuit connector 150 in a stack module 100 is thermally connected to each of the integrated circuit packages 120 in the module so that thermal energy generated by the integrated circuit devices will be conducted through the ground plane and thermal elements 160b and into, e.g., a ground plane of the next level of electronic assembly (e.g., PC board). This provides additional improvements in thermal performance.

In the depicted embodiment, distal ends 162 are tabs that are bent into "J"s for interconnecting, preferably with the assistance of solder (or another suitable bonding material), to the aligned external leads 130. However, a distal end 162 may constitute any suitable structure for connecting aligned external leads to one another. Such an end could include but is not limited to J-shaped tabs, C-shaped tabs, bifurcated ends, and gull wing tab ends.

Figure 6:
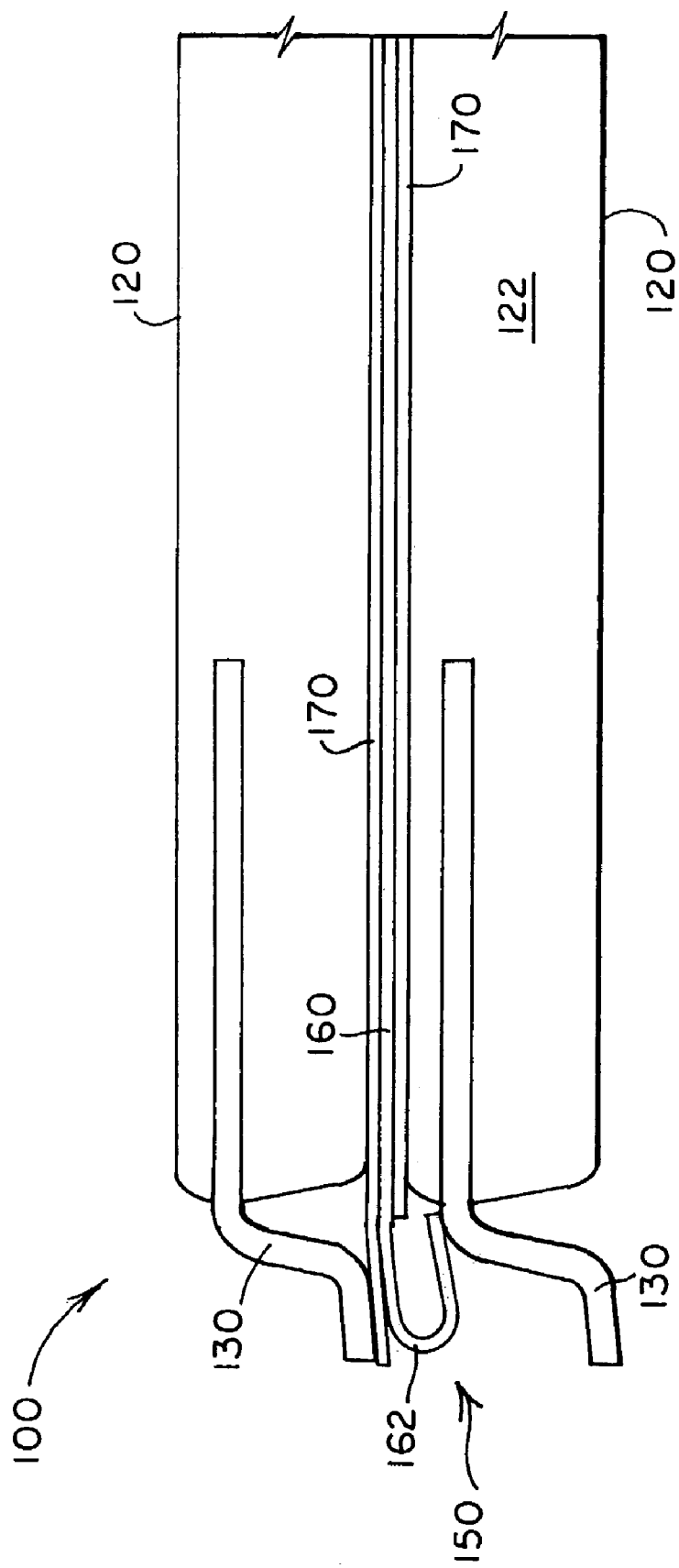
FIG. 6 depicts an extended insulative layer to separate a flexible circuit conductor from a corresponding external lead of the top IC package.
Figure 7A:
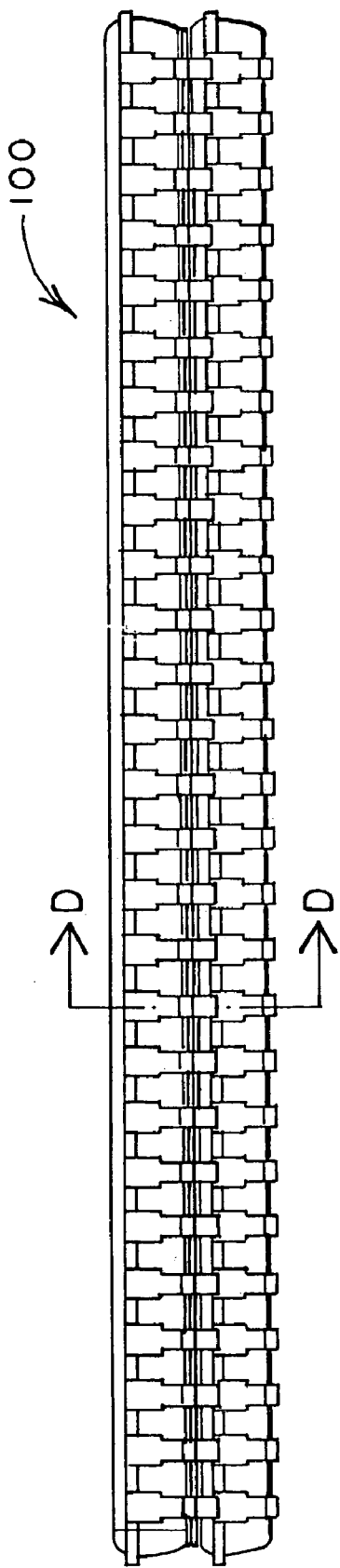
FIGS. 7A and 7B depicts an extended insulative later to separate the flexible circuit conductor from the corresponding external lead of the bottom IC package.
Figure 7B:
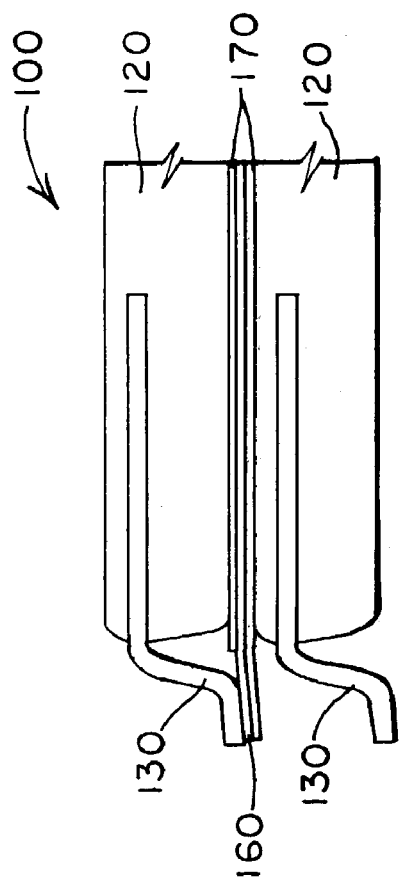

In addition, variations on the external leads 130 can be used for a variety of desired connections schemes. For example, as shown in FIG. 6, by extending the insulation layer on one side of distal end 162 at the point of contact between upper external lead 130 and the distal end 162, the upper lead may be electrically isolated from the module 100. Conversely, as shown in FIG. 7, the lower external lead 130 can be isolated by straightening distal end 162 with the extended insulator layer 170 on the lower side. In addition, selected leads 130 may be cut in chorus with the appropriate use and placement of conductors 160 in order to effectuate desired circuit configurations.

Flexible circuit connector 150 provides a versatile solution for stacking IC devices in an IC module. Moreover, it allows individual packages 120 from the IC module 100 to be individually addressed. The following brief exemplary embodiment illustrates this capability. In this example, assume that module 100 is a memory module with individually addressable, like memory devices 110 in packages 120, which have the same pin-out (lead) configuration. With this example, discrete singular conductors 160a could be used to interconnect aligned upper and lower leads such as data, address and clock leads, that may be connected to one another from one chip to the next. Ground plane conductors 160b could be used to interconnect leads that are to be grounded within single and between adjacent devices. Isolated leads (i.e., leads such as Chip Select that require isolation from other leads within the module) may be individually accessed through the use of jumper conductors 160c and external reserved, unused or No Connect ("NC") leads 130. In one embodiment, a jumper conductor 160c connects the relevant isolated lead to a reserved, unused or No Connect lead on the chip. The reserved, unused or No Connect lead, in turn, is connected through one or more aligned and coupled reserved, unused or No Connect leads to the desired connection on the board.

It will be seen by those skilled in the art that various changes may be made without departing from the spirit and scope of the invention. For example, while the stack module 100 has primarily been described in terms of a first and a second IC device, skilled persons will recognize that a stack module of the present invention may include multiple stacked IC devices coupled together by flexible circuit conductors mounted between adjacent devices.

Figure 5:
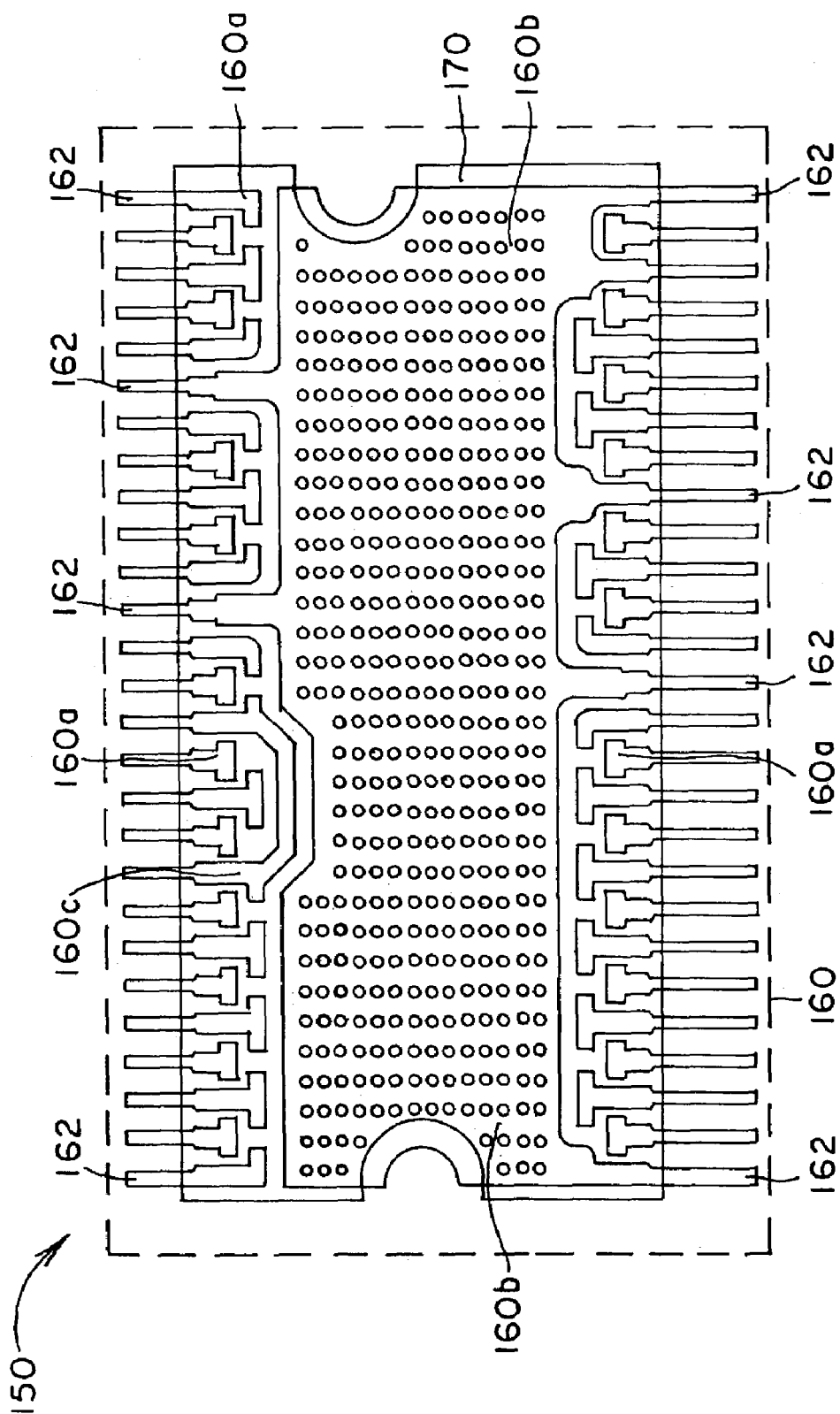
FIG. 5 shows a top view of another embodiment of a flexible circuit connector for a stacked chip module of the present invention.

In addition, the discrete conductors can be configured in any number of manners. For example, FIG. 5 depicts another embodiment of a flexible circuit connector for stacked IC devices. Moreover, not only can the conductors 160 be arranged and shaped in a variety of ways to suit a particular scheme, but also, with conventional flexible circuit techniques, they could overlap one another in various layers for complex interconnections. In addition, while the conductor assembly, which is composed of the plurality of discrete conductors in a connector, has been depicted as having a flat, planar geometry, skilled artisans would recognize that it could have any suitable geometry in conformance with the geometries of the upper and lower sides of particular devices to be stacked. Furthermore, in the depicted embodiment, Thin Small Outline Packaged (TSOP) devices with leads extending from one pair of oppositely-facing peripheral sides are shown. However, the invention can be used with any commercially available packaged devices and other devices including but not limited to TSOP, custom thin, and high lead count packaged integrated circuit devices.

Accordingly, the present invention is not limited to that which is expressly shown in the drawings and described in the specification.

The invention claimed is:

1. A stacked IC module comprising:
   (a) first and second packages, each of the first and second packages comprising: (1) top, bottom, and peripheral sides; and (2) external leads that extend out from at least one of the peripheral sides;
   (b) a flexible circuit connector mounted between the first and second packages; and
   (c) the flexible circuit connector including discrete conductors each with distal ends that interconnect selected external leads of the second package only to selected external leads of the first package.

2. The stacked IC module of claim 1 in which the flexible circuit connector is mounted between the first and second packages with a thermally conductive adhesive.

3. The stacked IC module of claim 2 in which the thermally conductive adhesive is a dry film adhesive.

4. The stacked IC module of claim 2 in which the thermally conductive adhesive is a liquid adhesive.

5. The stacked IC module of claim 1 in which at least some of the discrete conductors overlap one another.

6. A stacked IC module comprising:
   (a) first and second IC packages each having top, bottom, and peripheral sides and external leads that extend from at least one peripheral side;
   (b) a flexible circuit connector having an upper side and a lower side, the flexible circuit connector being disposed between the first and second IC packages, the flexible circuit connector having:
      a set of singular conductors, each one of the set of singular conductors having at least one distal extension, each of the distal extensions connecting a selected external lead of the second IC package only to a selected external lead of the first IC package.

* * * * *